United States Patent
Storck, Jr. et al.

(10) Patent No.: US 6,616,524 B2
(45) Date of Patent: Sep. 9, 2003

(54) RAISED FLOOR AIR HANDLING UNIT

(76) Inventors: Gary A. Storck, Jr., 640 Rosita, Los Altos, CA (US) 94024; Wesley W. Weigel, 10726 Larry Way, Cupertino, CA (US) 95014; Jay D. Ray, 16500 Sanborn Rd., Saratoga, CA (US) 95070

( * ) Notice: Subject to any disclaimer, the term of this patent is extended or adjusted under 35 U.S.C. 154(b) by 0 days.

(21) Appl. No.: 10/008,728

(22) Filed: Nov. 8, 2001

(65) Prior Publication Data

US 2002/0055329 A1 May 9, 2002

Related U.S. Application Data

(60) Provisional application No. 60/247,281, filed on Nov. 9, 2000.

(51) Int. Cl.[7] ............................................... H05K 7/20
(52) U.S. Cl. ........................ 454/184; 62/419; 62/426; 361/678; 361/696; 454/186; 454/306; 454/903
(58) Field of Search ................... 454/184, 186, 454/306, 230, 231, 233, 903; 361/678, 690, 691, 692, 693, 695, 696; 62/419, 426

(56) References Cited

U.S. PATENT DOCUMENTS 5,345,779 A * 9/1994 Feeney ..................... 361/695
5,403,232 A * 4/1995 Helm et al. ................. 454/230
6,318,113 B1 * 11/2001 Levy et al. ................. 454/306
2002/0025775 A1 * 2/2002 Herbreteau ................. 454/184

* cited by examiner

*Primary Examiner*—Harold Joyce

(57) ABSTRACT

A raised floor air handling system for use in a building that is used in combination with and set into an elevated floor assembly that is mounted on a principal floor of a building so as to provide an air plenum between the two floors. An air handling assembly is mounted below an integral raised or elevated floor tile to pull air via a radial impeller fan from the air plenum and directs it vertically through the integral raised floor tile into air distribution ducting (flexible, anti-static fabric with nozzles, linear vents, or other types of perforations) and onto the equipment/location being served air. The raised floor tile is designed to match the load rating of other floor tiles to become an integral part of the elevated floor assembly. The ducting attaches to the top of the raised floor tile via removable duct collars and is supported vertically/horizontally by miscellaneous hardware attached to existing/new structures.

30 Claims, 12 Drawing Sheets

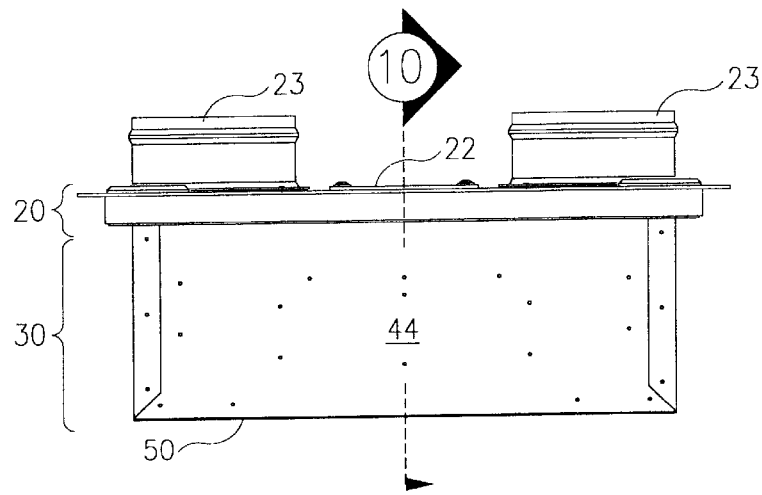
FIG. 9
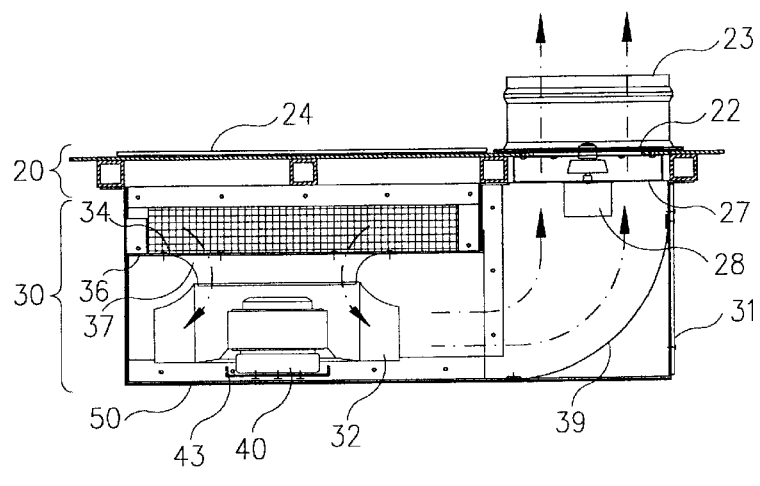 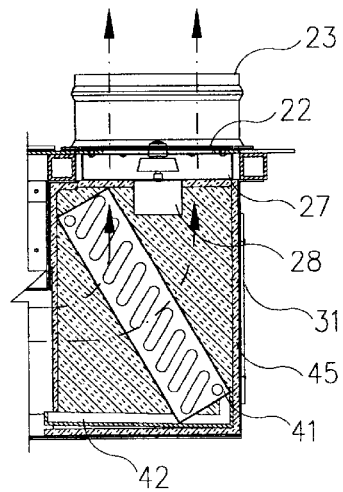
FIG. 10  FIG. 11

RAISED FLOOR AIR HANDLING UNIT

CROSS REFERENCE TO RELATED APPLICATIONS

This application claims the benefit of U.S. Provisional Patent Application No. 60/247,281, filed Nov. 9, 2000.

FIELD OF THE INVENTION

The present invention relates to an air handling system. More particularly, it relates to an air conditioning/heating system for use in computer rooms and data centers to provide climate control for electronic equipment such as computers, servers, routers, switches and other networking equipment.

BACKGROUND OF THE INVENTION

Operators, managers, designers, and developers of large data centers and computer rooms are constantly striving to put as much computer hardware into their available space as they can. This has led to tall, compact, double-sided rack systems set atop raised computer room floors. At the same time, computing speed is increasing per Moore's law due to the demand for and development of more complex software and interfaces. This also leads to more heat generation. These two factors combined have greatly reduced the effectiveness of traditional cooling systems, such as Computer Room Air Conditioners (CRACs), Computer Room Air Handlers (CRAHs), In Space Units (ISUs), etc.

In the past, most large data centers and computer rooms have utilized many small packaged CRACs or CRAHs located atop the raised floor amongst the computer and server equipment. Both of these systems pull warm air in at the top (~5–6' above the raised floor), condition the air (per temperature and humidity setpoints), and provide cool air to an underfloor plenum (under the raised floor). Air is then passively allowed out of the underfloor plenum through the use of perforated floor tiles.

The heat that is pulled out of the air is then transferred out of each of the CRACs or CRAHs via underfloor condenser or chilled water piping systems to cooling towers and/or chillers located outside of the data center. Each CRAC or CRAH is also served by condensate and makeup water piping for humidity control. All of this piping interferes with the cool air that is being distributed under the floor and decreases the air supply or static pressure. Also, if the condenser water piping is not insulated, the heat in the condenser water can be transferred to the air under the floor before it has a chance to cool the servers and computers, thus providing warm air supply to the servers and computers.

Since the cool air is passively allowed out of the underfloor plenum, the distance that the air moves out of the perforated tiles relies on the pressure from the CRACs or CRAHs, the number of perforated tiles, the size/quantity of perforations, and the amount of space served by the CRACs and CRAHs. However, even if high pressure blowers were utilized in the CRACs, there can still be areas where there is not enough cool air coming out of the floorspace.

Also, since warm air rises and cool air drops, natural convection typically overpowers the trickle of cool air from the floor tiles. Without active circulation in place (natural or otherwise), the air stratifies into different temperature layers. This results in higher supply and operating temperatures on servers at the tops of the racks. With a traditional data center cooling system, temperatures of 80 to 90° F. (or more) have been seen at the intake of servers from the middle to the tops of the racks versus the 60 to 70° F. available under the raised floor.

At elevated temperatures, electronic components can fail catastrophically or the electrical characteristics of the chips can undergo intermittent or permanent changes. Manufacturers of processors and other computer components specify a maximum operating temperature for their products. Most devices are not certified to function properly beyond 50° C.–80° C. (122° F.–176° F. However, a loaded server/computer with standard cooling can easily experience operating temperatures that exceed the limits. The result can be memory errors, hard disk read-write errors, faulty video, and other problems not commonly recognized as heat related.

There have been many studies by public and private agencies over the years that have found that the life of an electronic device is directly related to its operating temperature. These studies, based on empirical data, were used to create models/standards for determining electronic equipment reliability. (MIL-HDBK-217, Bellcore TR-332, and the Arrhenius equation are examples.) Based on the Arrhenius equation, it can be seen that each 10° C. (18° F.) temperature rise reduces component life by 50%. Conversely, each 10° C. (18° F.) temperature reduction increases component life by 100%. Therefore, it is recommended that computer components be kept as cool as possible for maximum reliability, longevity, and return on investment.

It is the objective of this invention to provide cool air evenly to the electronic equipment, eliminate the air stratification, extend the life and increase the reliability of electronic equipment while minimizing the impact on the floorspace, since space on a computer room or server room floor is typically a commodity.

SUMMARY OF THE INVENTION

The present invention takes the form of raised floor air handling units. The units actively pull cool air from the underfloor plenum through a custom raised floor tile with bulkhead fittings to flexible anti-static fabric ductwork supported vertically (or other air distribution systems). This ductwork then directs the cool air equally across the face of all electronic equipment on each rack or cabinet via nozzles, reinforced linear slots, or other air distribution methods. This, coupled with a properly designed computer room cooling system, eliminates heat added to the room and the associated stratification. Therefore, with a cooler air supply to all of the servers from the raised floor air handling units, the annual cost for server replacement (not including interruption of service) could be reduced by as much as 50%. Note that additional savings can also be achieved by the elimination of problems from customer dissatisfaction associated with the equipment overheating issues, which is typically more valuable than the replacement costs. Financial losses from possible disruption in service due to overheating would also be reduced.

By implementing the raised floor air handling units, the typical computer room air conditioning units can be eliminated and centralized air handling or air conditioning systems can be installed remotely on roof or in a mechanical room to handle the climate control, move the cool air under the floor, and pull the warm air back from above the racks. In new construction, it not only eliminates the installation cost of the CRACs, CRAHs, and ISUs, but also the associated piping and wiring under the floor. This would, in turn, save on energy costs associated with the losses in the piping and electrical.

Also, since the raised floor air handling units can be installed in walkways in front of the server racks and allow a person to still use the walkway, the additional floorspace freed up by the elimination/relocation of the computer room air conditioning units can be used to generate additional revenue and/or allow the installation of more computer racks.

BRIEF DESCRIPTION OF THE DRAWINGS

FIG. 9 is an elevation view of the "intake" end of the raised floor air handling unit without its air distribution ducting.

FIG. 10 is a cross sectional view of FIG. 9 showing the inner workings of the raised floor air handling unit.

FIG. 11 is a partial cross sectional view of the raised floor air handling unit to show an optional chilled water coil.

DETAILED DESCRIPTION OF THE INVENTION

Figure 1:
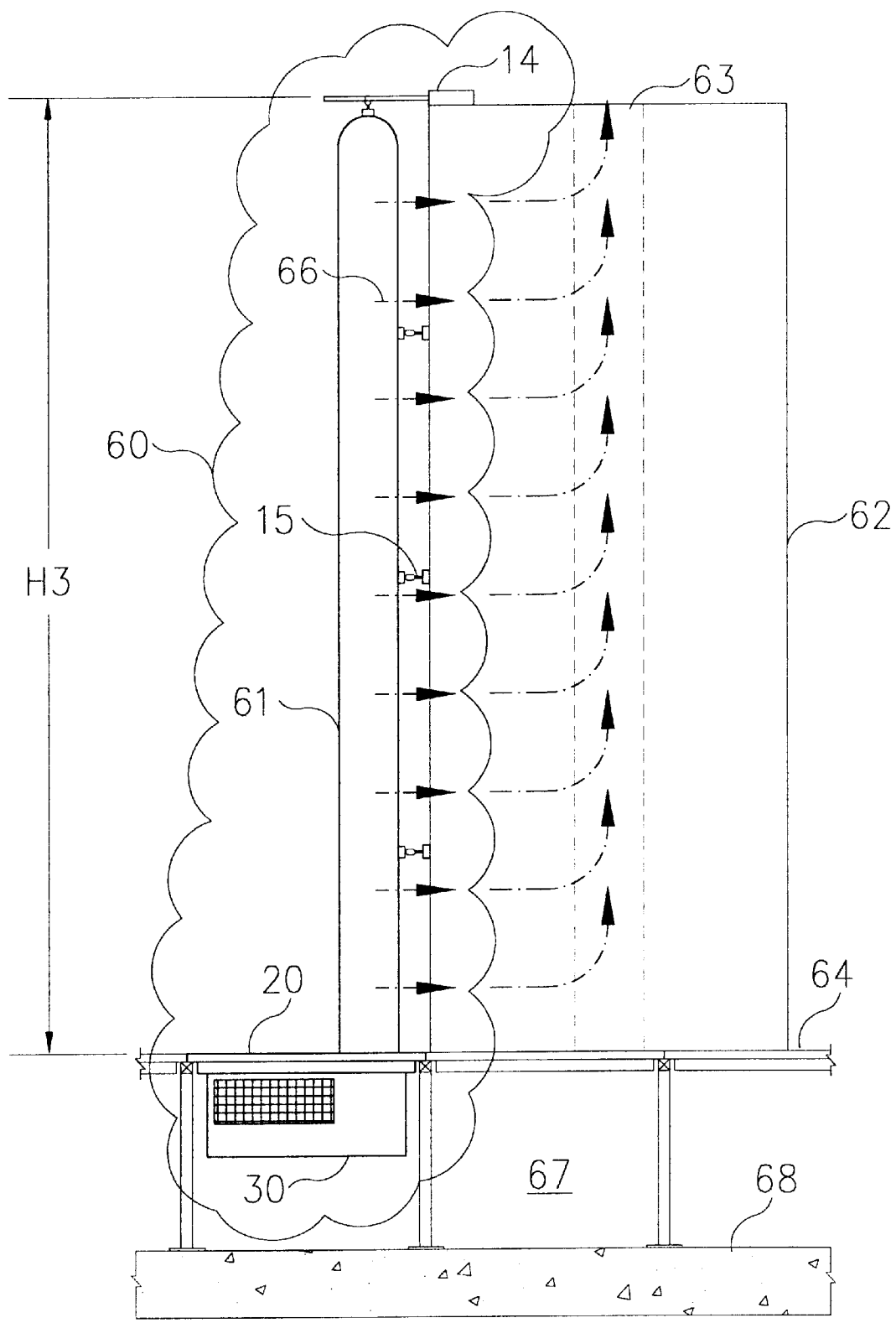
FIG. 1 provides an elevation to show the application of the raised floor air handling unit in a raised floor system providing air to server/computer racks or cabinets with air intakes on the exterior of the rack or cabinet.

The implementation of the first embodiment of the raised floor air handling unit 60 is shown in the elevation provided in FIG. 1. In this figure, one can see that the raised floor air handling unit 60 is designed to sit in and become an integral part of an elevated floor assembly or raised floor tile system 64 that sits above the floor 68 of a building. The space between the raised floor tile system 64 and the building floor 68 is typically utilized as an underfloor cool air plenum 67. Cool air can be distributed into the underfloor cool air plenum 67 by a separate air conditioning system or by multiple systems. However, the raised floor air handling unit can be provided with an internal chilled water coil 41 as seen in the section view provided in FIG. 11. Although the chilled water coil 41 is not part of the all of the embodiments, the addition of this option eliminates the need for a separate air conditioning system and the air plenum 67 can be used as a return air plenum where the air is cooled inside the raised floor air handling unit 60. In either case, FIG. 1 shows that air is pulled from the underfloor air plenum 67 into the raised floor air handling unit 60 via a fan inside of the air handler 30 and pushes up through the integral raised floor tile 20 into ducting 61 or another type of air distribution equipment, such as registers, manifold, nozzles, etc. (as seen in FIGS. 16–22) and supplies air 66 onto the face of the electronic equipment in a rack or cabinet 62. This supply air could also be used for comfort cooling/heating of personnel, ventilation, makeup air, or other processes. One embodiment utilizes flexible anti-static fabric ducting 61 that is hung vertically by a vertical duct support arm/bracket 14 approximately the same height H3 as the rack or cabinet 62 (typically 8'); however, the ducting can be custom built to a customer specified length. The ducting is held in place horizontally by vertical duct support arm/brackets 15 attached to the server/computer rack or cabinet 62 or some other structural component such as a cable tray; however, alternative air distribution methods and support systems can be utilized such as spring-loaded, retractable cable reels to allow access to the electronic equipment without disconnecting the ductwork. The supply air 66 would then be pulled in by the circulation fans internal to the electronic equipment located in the rack or cabinet 62 and exhausted from the rack or cabinet 62 via an exhaust air plenum 63.

Figure 2:
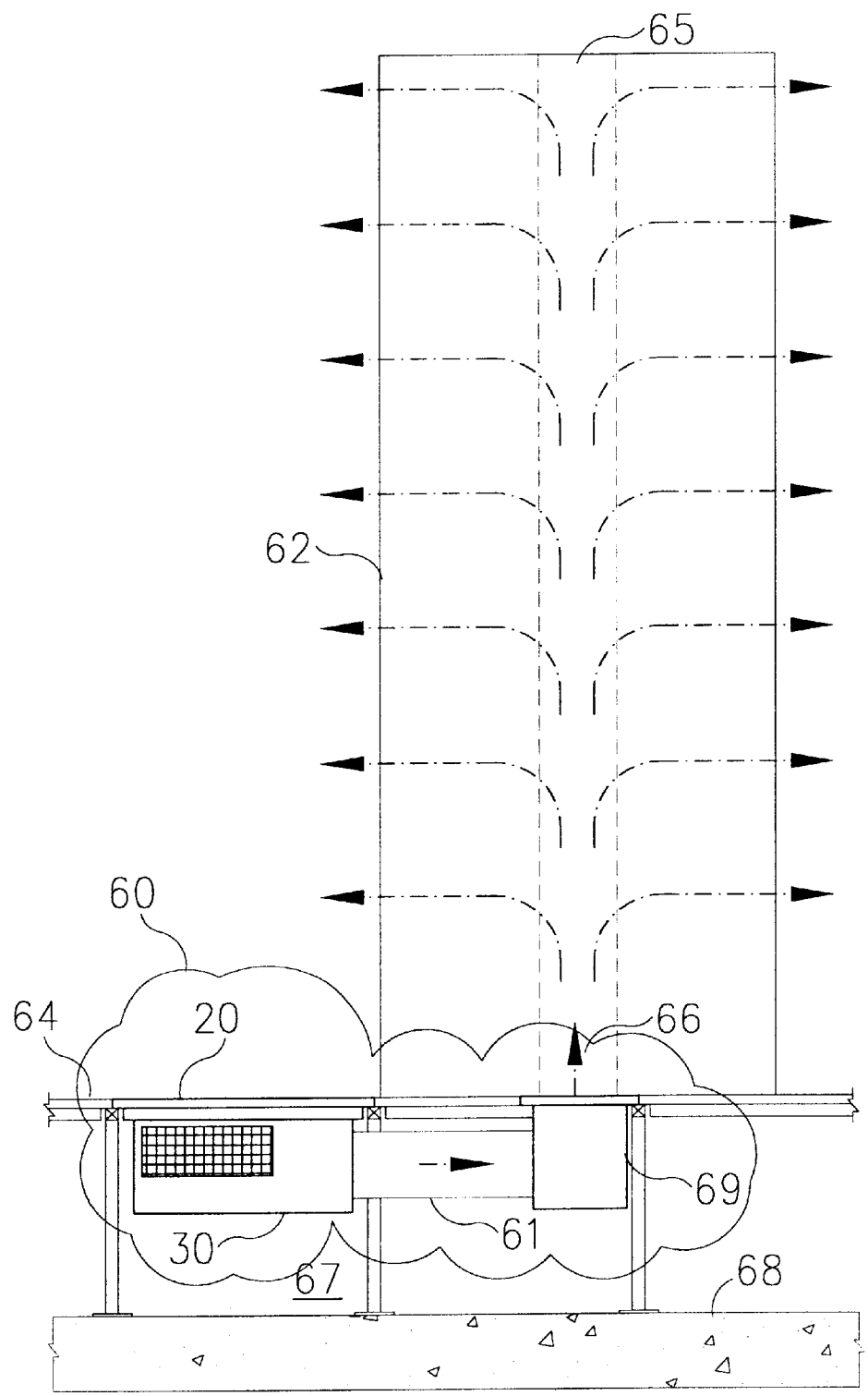
FIG. 2 provides an elevation to show the application of the raised floor air handling unit in a raised floor system providing air to server/computer racks or cabinets with air intakes on the interior of the rack or cabinet.

One option to the implementation of the raised floor air handling unit 60 is shown in the elevation in FIG. 2. It is a similar configuration to the implementation shown in FIG. 1; however, the air handler section 30 pushes air horizontally into ducting 61 below the raised floor 64 into an underfloor air supply plenum box 69 that then directs the cool air 66 up through the raised floor tile 64 into the supply air plenum 65 of a server/computer rack or cabinet 62. However, note that the ducting could route the air directly to the supply air plenum 65 of a server/computer rack or cabinet 62 without an underfloor air supply plenum box 69.

Figure 3:
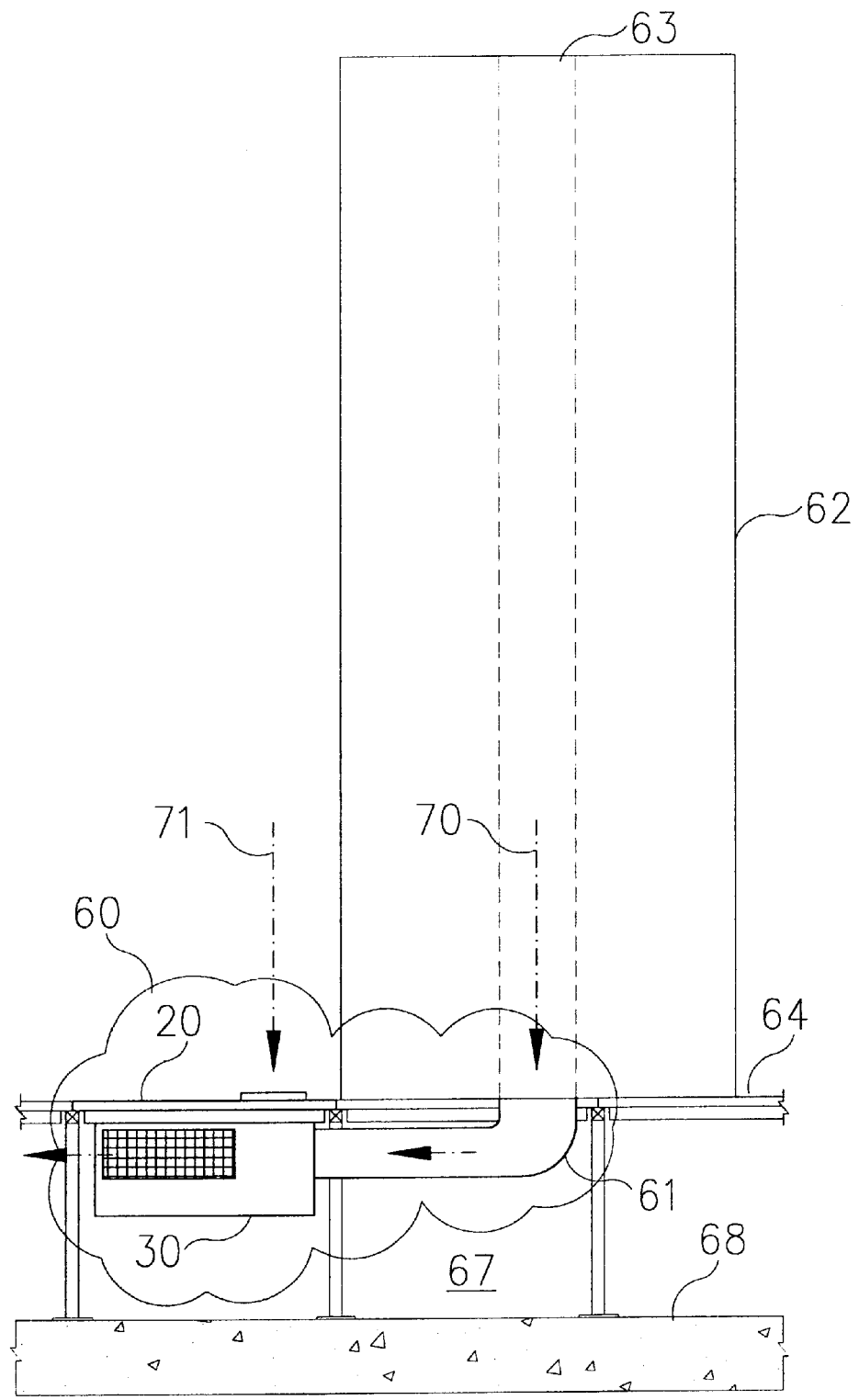
FIG. 3 provides an elevation to show the application of the raised floor air handling unit in a raised floor system pulling air from server/computer racks or cabinets with exhaust air plenums on the interior of the rack or cabinet.

Another option to the implementation of the raised floor air handling unit 60 is shown in the elevation in FIG. 3. It is a similar configuration to the implementation shown in FIG. 1; however, warm air is pulled from the exhaust air plenum 63 at the bottom of the server/computer rack or cabinet 62, into the return air plenum 67, circulated into the air handler section 30, cooled through a chilled water coil 41 (as seen in FIG. 11), pushed into ducting 61 or another type of air distribution equipment, supplied 66 onto the face of the servers/computers in a server/computer rack or cabinet 62, into the exhaust air plenum 63, back into underfloor return air plenum 67, and recirculated back into the air handler section 30. This eliminates dependence on other air distribution systems for cooling the servers/computers in a server/computer rack or cabinet 62. Also, note that ducting could be added between the exhaust air plenum 63 and the air handler section 30 to enhance the air circulation through the server/computer rack or cabinet 62.

Figure 4:
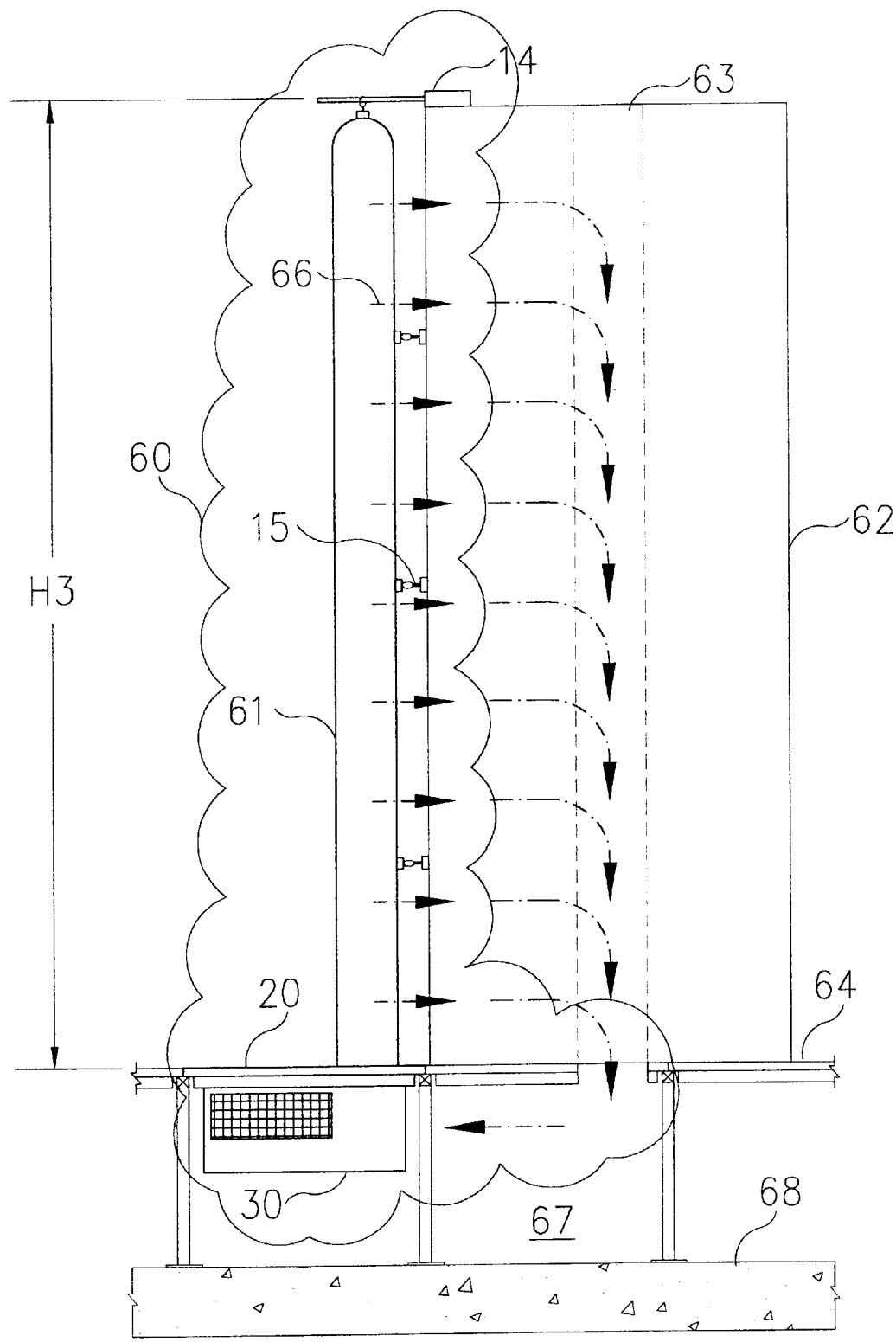
FIG. 4 provides an elevation to show the application of the raised floor air handling unit in a raised floor system recirculate air to and from server/computer racks or cabinets with exhaust air plenums on the interior of the rack or cabinet.

Another option to the implementation of the raised floor air handling unit 60 is shown in the elevation in FIG. 4. It is a similar configuration to the implementation shown in FIG. 3; however, warm air is pulled from the exhaust air plenum 63 at the bottom of the server/computer rack or cabinet 62 through ducting into the air handler section 30, and exhausted into the return air plenum 67.

Figure 5:
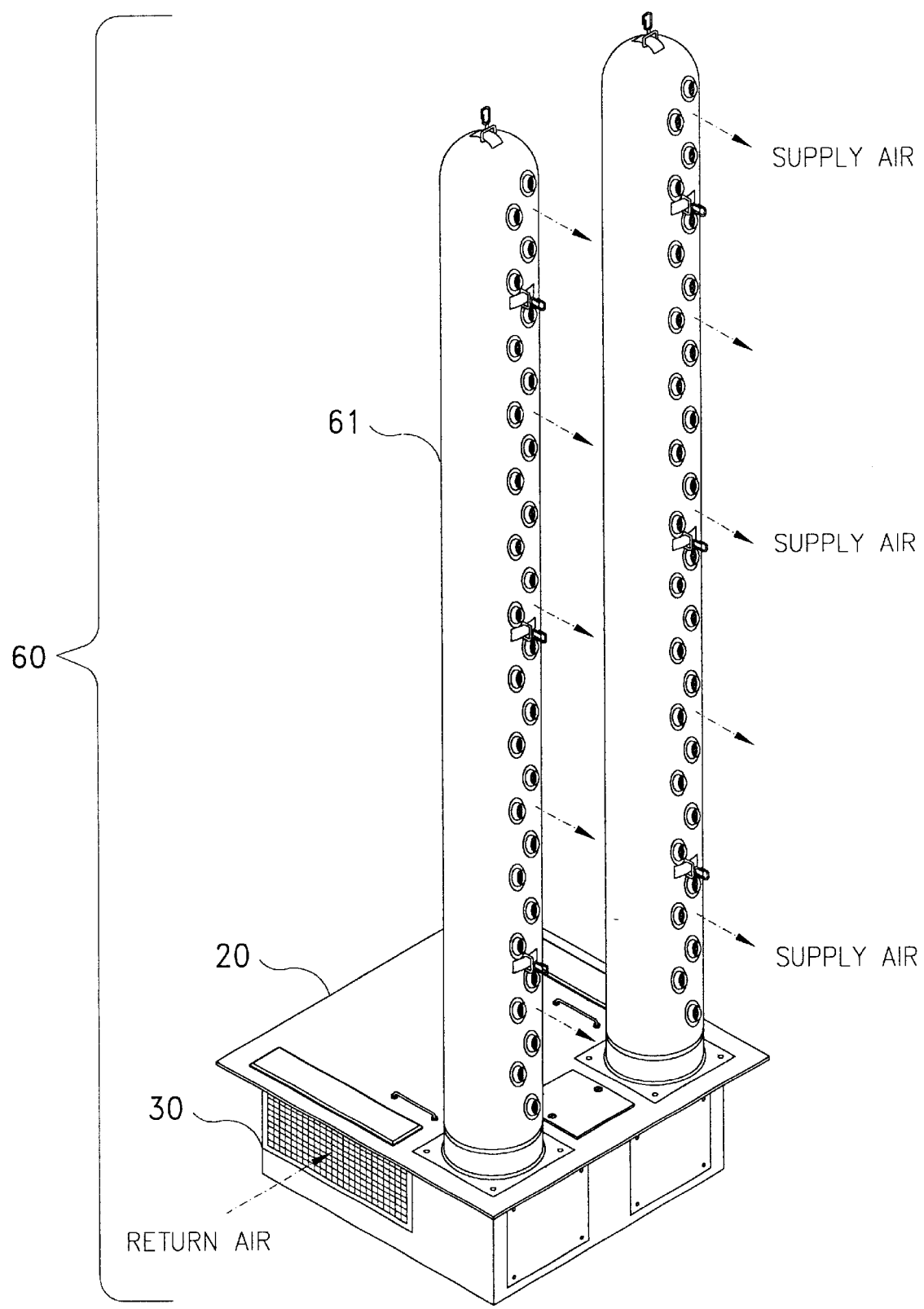
FIG. 5 is an isometric representation of the raised floor air handling unit assembly.

The first embodiment of the raised floor air handling unit is illustrated generally in FIG. 5. This system 60 consists of 3 main subassemblies: an air handling unit 30, raised floor tile 20, and ductwork 61. As previously shown, FIG. 5 shows air being pulled into the sides of the air handling unit 30, up through the raised floor tile 20, and pushed out through ductwork 61 or another form of air distribution equipment.

Figure 6:
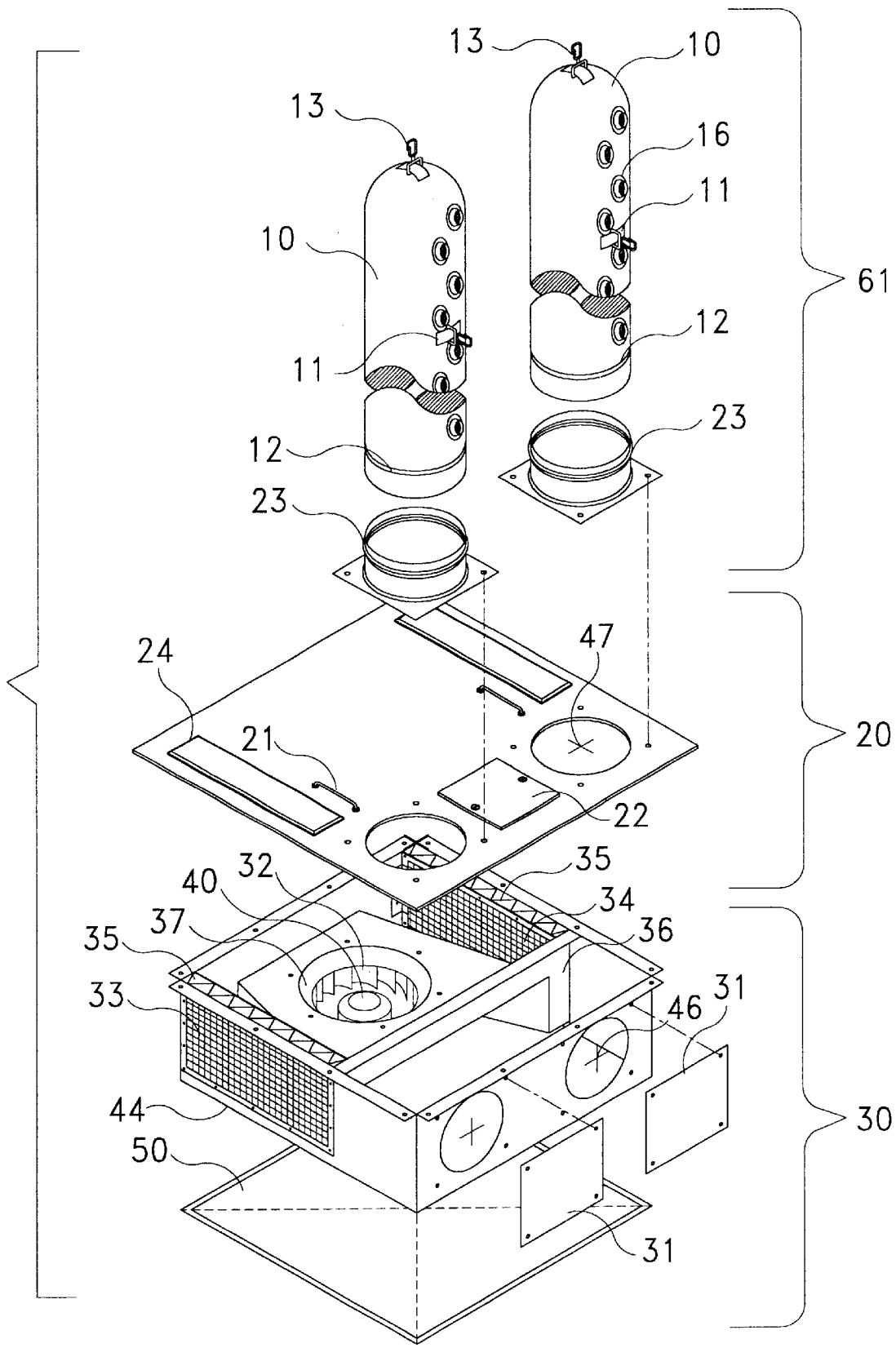
FIG. 6 is a partially-exploded isometric representation of the raised floor air handling unit assembly.

This embodiment is further represented in the partially exploded view provided in FIG. 6. The external shell of the air handling unit 30 includes a housing 44, a removable fan access cover 50, two duct blank-offs 31 that seal off alternate supply air openings 46 and can be interchanged with the two duct collars 23 (discussed later), and two inlet screens 33. The radial impeller fan 32 and fan motor 40 pull air into the air handling unit 30 through the inlet screens 33, optional filters 35, and optional filter retaining screens 34 into the intake plenum 36 down through the inlet ring 37 and radial impeller fan 32. This air is then directed up through the raised floor tile assembly 20 through the primary supply air openings 47. Optional filter access covers 24 are provided for easy access to the filters 35 without removing the raised floor air handling unit 60. Optional filter access covers 24 are provided for easy access to the filters 35 without removing the raised floor air handling unit 60. An optional controls access cover 22 is provided for controlling the raised floor air handling unit 60. The duct assembly 61 attaches to the raised floor assembly via duct collars 23 that channel the air from the primary supply air openings 47 into the air distribution ducts 10 and out of the supply air nozzles 16 or another type of air distribution orifice. The nozzles may be oriented horizontally or they may be angled up or down from horizontal anywhere from up 75 degrees to down 75 degrees, more preferably between up 45 degrees to down 45 degrees, and most preferably between up 25 degrees to down 25 degrees. In the embodiment shown, the nozzles are approximately horizontal. The nozzles 16 may also be oriented around the circumference of the duct 10 to provide air to a single vertical line, part or the entire surrounding area. Therefore the nozzles 16 may be in a single vertical line or the nozzles 16 may extend around 360 degrees, 270 degrees, 180 degrees, 90 degrees, etc. or any amount in between. The embodiment shown has the nozzles 16 at 19 degrees each direction from the center line. The air distribution ducts 10 are fastened to the duct collars 23 via a band clamp 12, strap, or other similar attachment means, supported vertically by a vertical duct support clip 13, and supported horizontally by a horizontal duct support clip 11. These duct support clips are then attached to the vertical and horizontal duct support arm/bracket assemblies (14 & 15, respectively) as shown in FIGS. 1–3.

Figure 7:
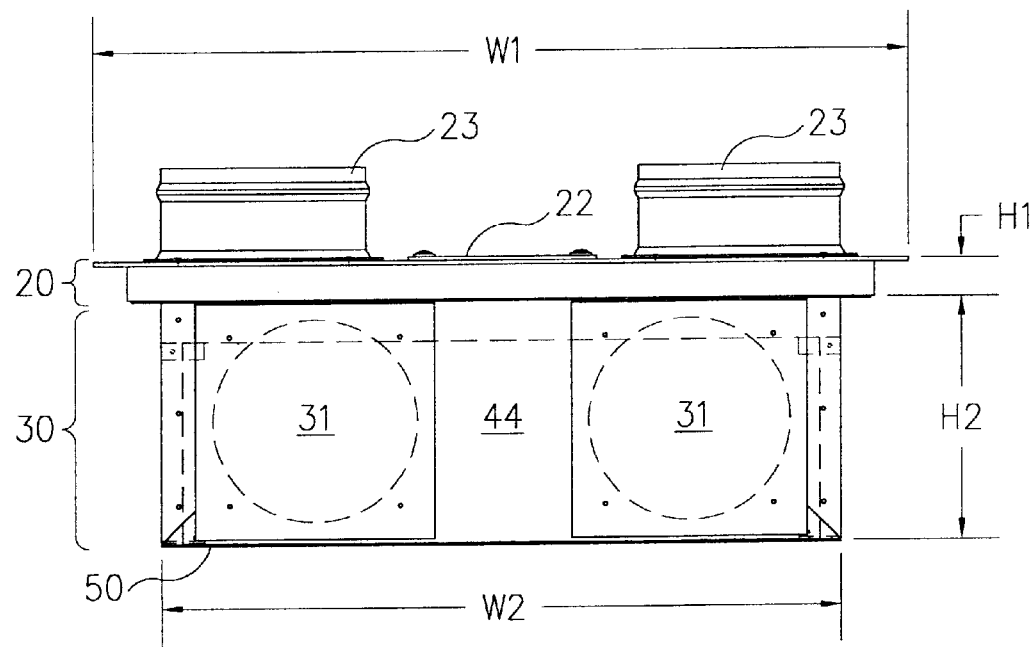
FIG. 7 is an elevation view of the supply end of the raised floor air handling unit without its air distribution ducting.
Figure 8:
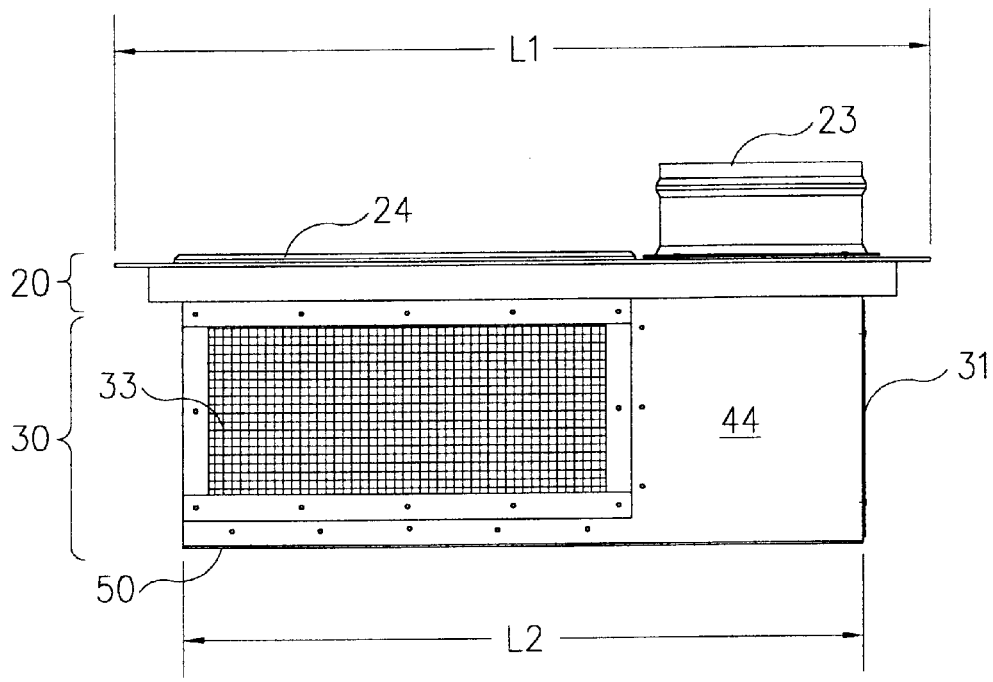
FIG. 8 is an elevation view of the side of the raised floor air handling unit without its air distribution ducting.

FIGS. 7–9 provide elevation views of the raised floor air handling unit without the ducting. In these views, one can see the relationships between the previously mentioned assemblies and parts. In the embodiment shown, dimensions L1, L2, W1, W2, H1, and H2, would accommodate a standard 24" length×24" width×18" depth floor tile assembly; however, custom dimensions can be accommodated. Additionally, FIG. 9 refers to a cross section provided in FIG. 10.

The internal workings of the first embodiment are shown in the cross section provided in FIG. 10. This cross section shows the air after it has already been pulled through the optional inlet screens 33, filters 35, filter retainer screens 34, and into the intake plenum 36. The air is then pulled through the inlet ring 37 to the radial impeller fan 32, diverted up by an airflow diverter 39 through the raised floor tile assembly 20 and duct collars 23 into the ducting 61. Although the controls 28, control panel 27, and controls access cover 22 impede the air flow in this cross section, the air still flows into the duct collars 23 on either side of these controls. Additional diverters could be implemented around the control panel 27 to enhance the air flow into the duct collars. FIG. 10 also shows the fan motor 40 mounted via a fan mounting bracket 43; however, this can be accomplished in any other manner as necessary.

FIG 11 shows the implementation of an optional chilled water coil 41 where the airflow diverter 39 was shown previously in FIG. 10. FIG. 11 also shows the implementation of insulation 45 and a condensate pan to support the implementation of the chilled water coil 41. However, note that other components could be provided in support of the chilled water coil 41 such as a condensate pump, chilled water control valve, and additional/different controls.

Figure 12:
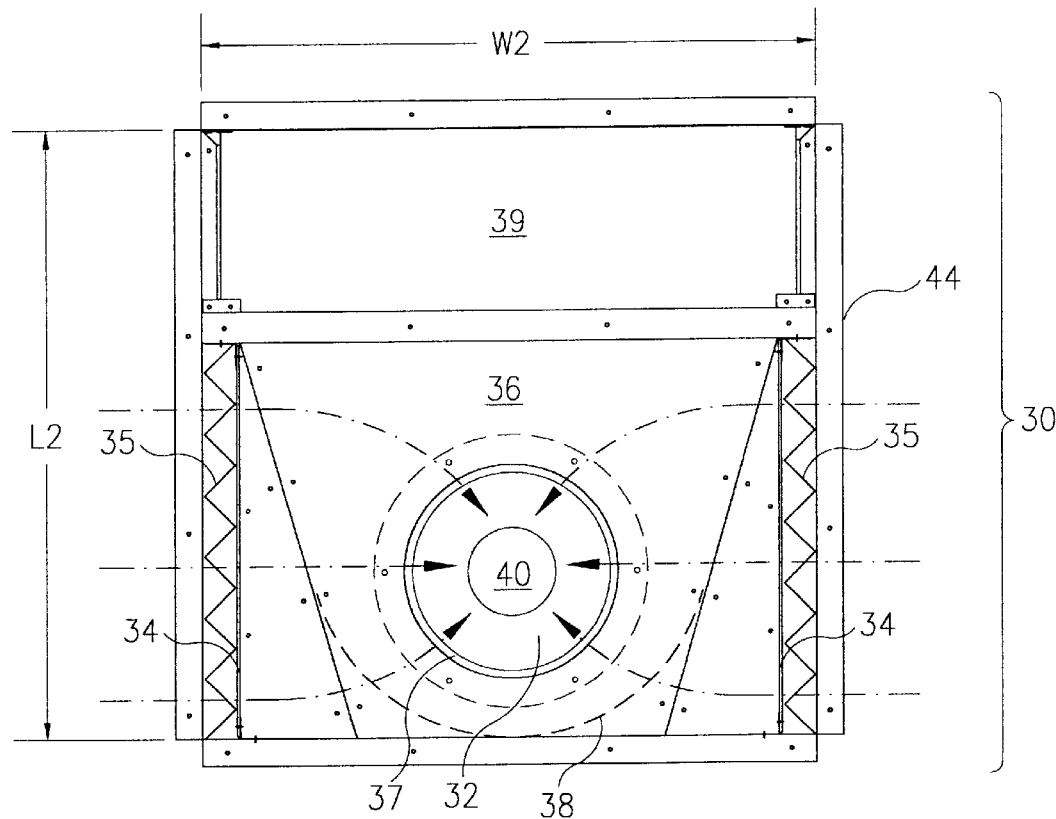
FIG. 12 is a plan view of the of the raised floor air handling unit from the top without the floor tile (air handling section only).
Figure 13:
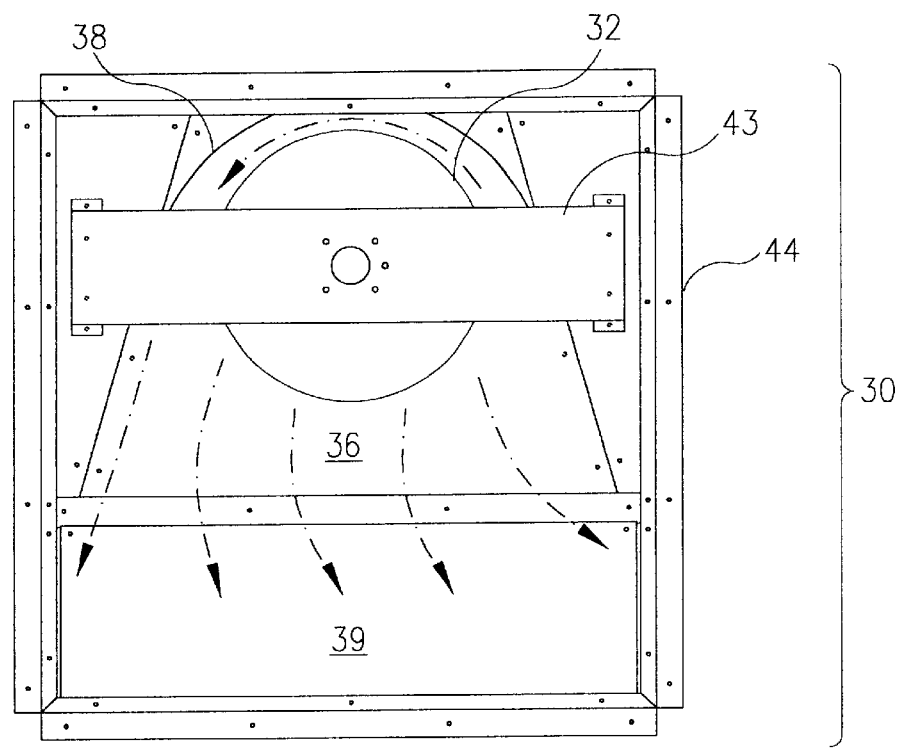
FIG. 13 is a plan view of the of the raised floor air handling unit from the bottom without the maintenance access cover (air handling section only).

FIGS. 12 & 13 provide plan views of the first embodiment of the air handling unit 30 assembly where FIG. 12 is looking at it from the top without the raised floor tile attached and FIG. 13 is looking at it from the bottom without the fan access cover attached. In these views, one can see the relationships between the previously mentioned parts. In the embodiment shown, dimensions L2 and W2 would accommodate a standard 24"×24"×18"D floor tile assembly; however, larger, smaller, and different strength sizes could be created to accommodate custom dimensions and floor loads. Different size units may also be used in situations where more or less depth is available below the raised floor. One unique aspect shown in these views is the angular construction of the intake plenum 36 which allows for reduced air velocity through the optional filters 35 (as seen in FIG. 12) and diverts the airflow from the radial impeller fan 32 for better performance and reduced air noise.

Figure 14:
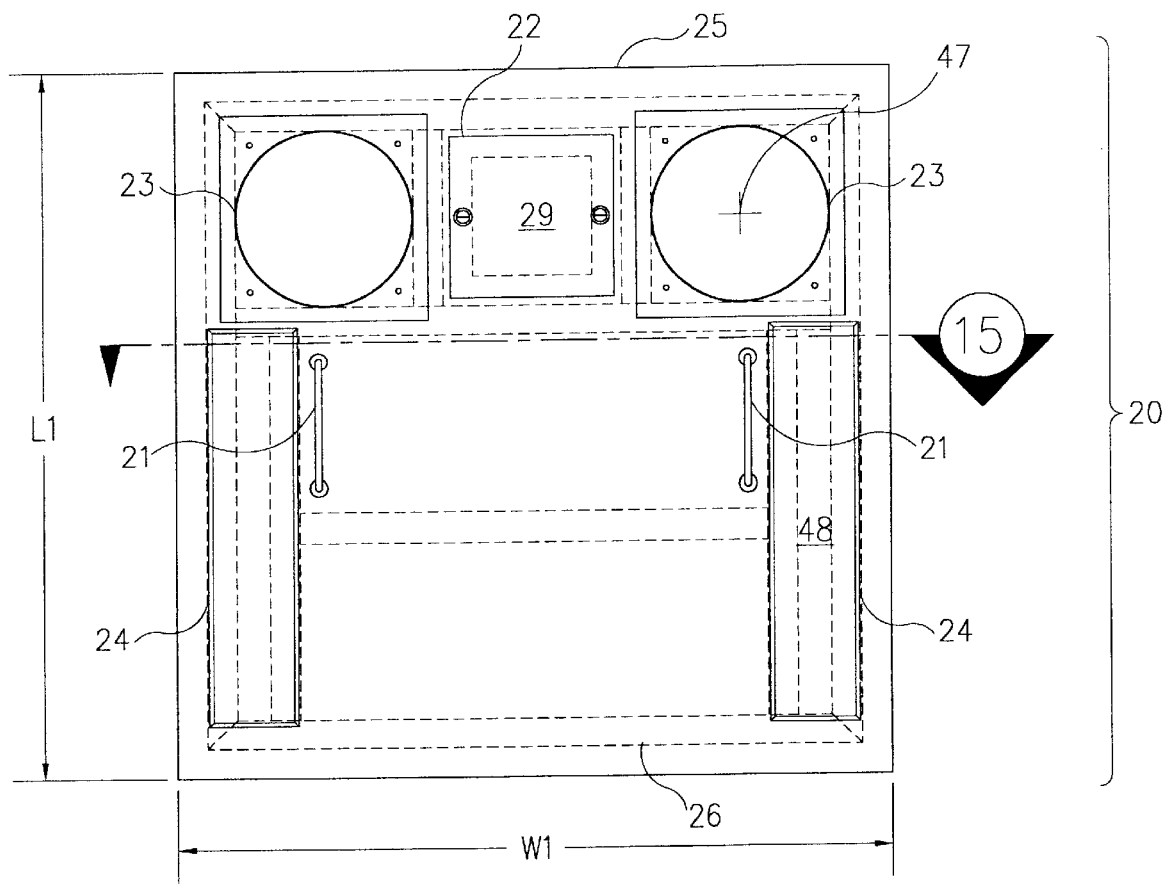
FIG. 14 is a plan view of the of the raised floor air handling unit.

FIG. 14 provides a plan view of the first embodiment of the raised floor tile assembly 20 with the duct collars 23 attached. The assembly 20 includes a tile plate 25 that is supported below by tubular steel framing/reinforcement 26, which also frames 5 openings in the tile plate 25: two primary supply air openings 47, two filter openings 48, and one control panel opening 29. Covering these openings is the ducting 61 mounted to the duct collars 23, filter access covers 24, and the controls access cover 22, respectively. Optional handles 21 are also shown.

Figure 15:
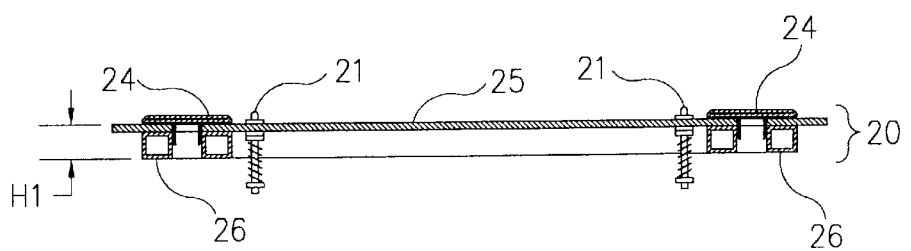
FIG. 15 is a partial cross sectional view of FIG. 14 showing the construction of the floor tile.

FIG. 15 provides a cross section of the first embodiment of the raised floor tile assembly 20. In this view, one can see the relationships between the previously mentioned parts.

Figure 16:
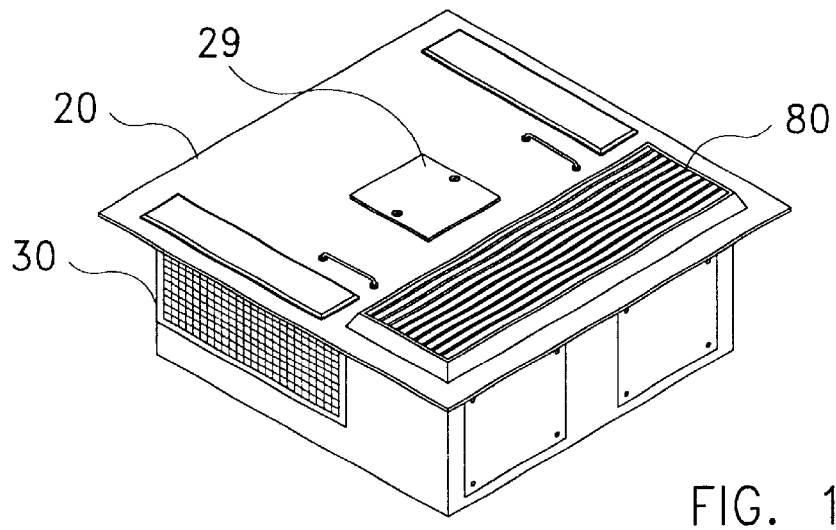
FIG. 16 is an isometric representation of the raised floor air handling unit assembly with a rectangular supply air register or exhaust air grille.

FIG. 16 provides an isometric of a rectangular supply register or exhaust grille 80 mounted to the raised floor tile assembly 20 in lieu of the ductwork 61 previously shown. The rectangular supply register or exhaust grille 80 can be installed with or without adjustable vanes to allow for the transfer of air without installing ductwork or its associated hardware. The incorporation of the rectangular supply register or exhaust grille 80 requires the control panel opening 29 to be relocated as shown.

Figure 17:
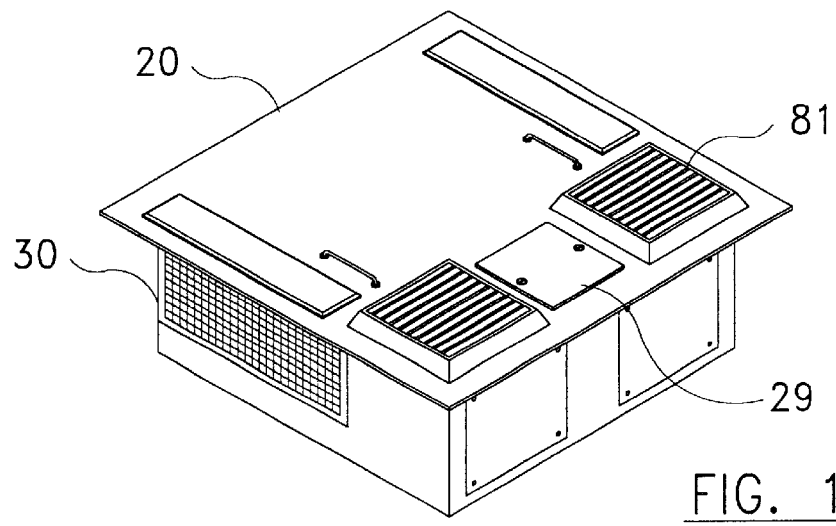
FIG. 17 is an isometric representation of the raised floor air handling unit assembly with two square supply air registers or exhaust air grilles.

FIG. 17 provides an isometric of two square supply registers or exhaust grilles 81 mounted to the raised floor tile assembly 20 in lieu of the ductwork 61 previously shown. The square supply registers or exhaust grilles 81 can be installed with or without adjustable vanes to allow for the transfer of air without installing ductwork 61 or its associated hardware.

Figure 18:
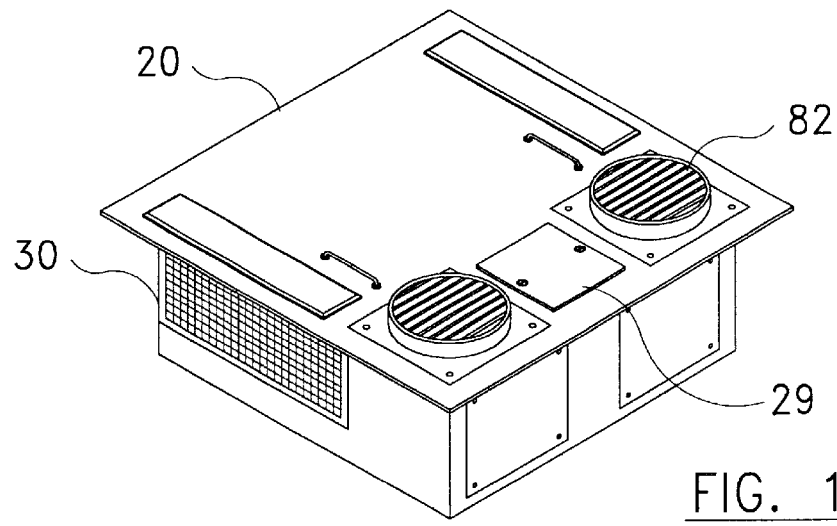
FIG. 18 is an isometric representation of the raised floor air handling unit assembly with two round supply air registers or exhaust air grilles.

FIG. 18 provides an isometric of two round supply registers or exhaust grilles 81 mounted to the raised floor tile assembly 20 in lieu of the ductwork 61 previously shown. The square supply registers or exhaust grilles 81 can be installed with or without adjustable vanes to allow for the transfer of air without installing ductwork 61 or its associated hardware.

Figure 19:
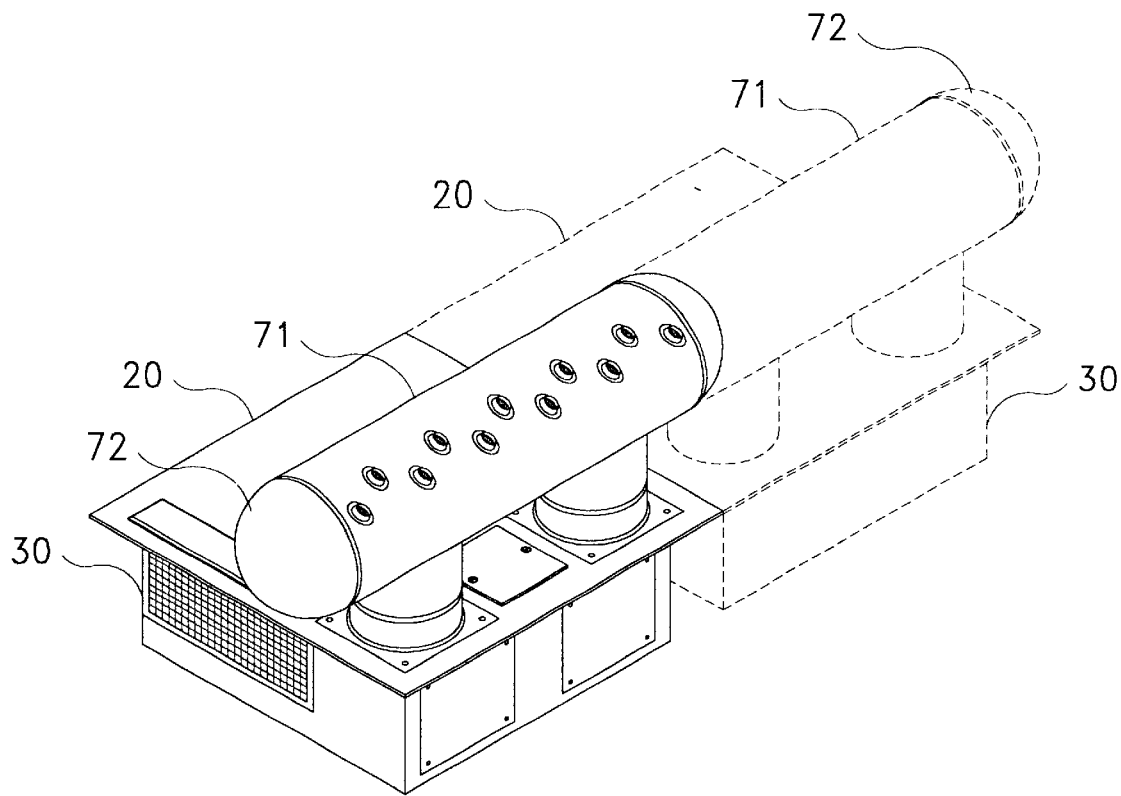
FIG. 19 is an isometric representation of the raised floor air handling unit assembly with a supply air manifold.

FIG. 19 provides an isometric of a supply air manifold 71 mounted to the raised floor tile assembly 20 in lieu of the ductwork 61 previously shown. The supply air manifold 71 can be connected to other supply air manifolds (as shown in the dashed lines) via removable manifold end caps 72. In this embodiment, the manifold 71 is placed horizontally. In other embodiments, the manifold 71 or duct 61 may be placed at any angle to the floor or wall.

Figures 20, 21, 22:
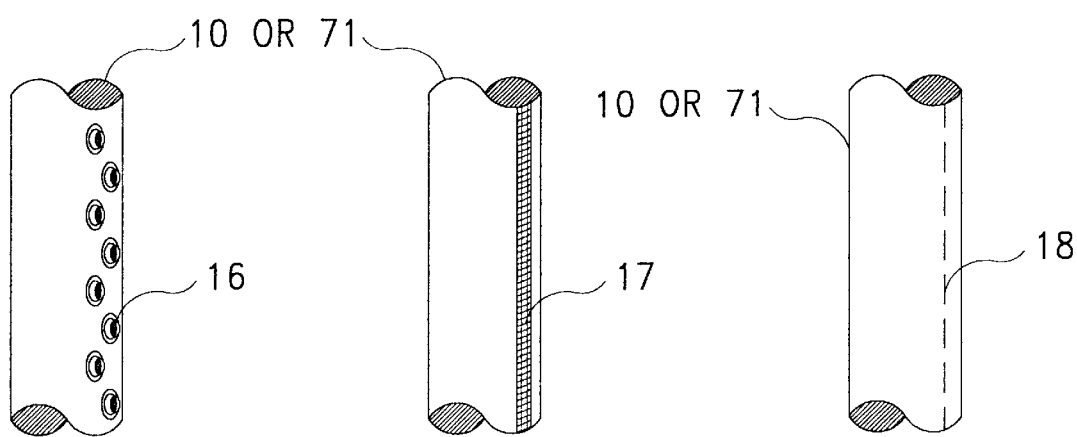
FIG. 20 is a representation of a supply air duct or manifold with nozzles for air distribution.
FIG. 21 is a representation of a supply air duct or manifold with a linear vent for air distribution.
FIG. 22 is a representation of a supply air duct or manifold with linear slots for air distribution.

FIGS. 20 through 22 provide alternative air outlets for air distribution ducts 10 or supply air manifolds 71. In FIG. 20, the outlets are supply air nozzles 16. FIG. 21 shows the outlets as supply air linear vents 17. FIG. 22 has supply air linear slits 18 as the outlets.

It will be readily apparent to those skilled in the air handling art that various modifications and changes can be made to the described air handling system without departing from the spirit and scope of this invention. For example, although the unit has been shown and described with a radial impeller fan, other types of fans, such as centrifugal or axial may be used. Accordingly, all such modifications and changes that fall within the scope of the appended claims are intended to be part of the present invention.

Reference Characters

H1—height of raised floor tile assembly (1.125" on standard design, can be adjusted for special applications)
H2—height of air handling unit (6" to 16", depending on options)
H3—height of ServAire ductwork
W1—width of raised floor tile assembly (24" on standard design, can be adjusted for special applications)
W2—width of air handling unit (20" on standard design, can be adjusted for special applications)
L1—length of raised floor tile assembly (24" on standard design, can be adjusted for special applications)
L2—length of air handling unit (20" on standard design, can be adjusted for special applications)
10. air distribution duct
11. interstitial duct support clip
12. band clamp
13. vertical duct support clip
14. vertical duct support arm/bracket
15. horizontal duct support arm/bracket
16. supply air nozzle(s)
17. supply air linear vent(s)
18. supply air linear slit(s)
20. raised floor tile
21. handle (optional, can be provided with other handle styles)
22. controls access cover
23. duct collar
24. filter access cover
25. tile plate
26. tubular steel framing/reinforcement (can be modified/enhanced for special applications)
27. control panel
28. controls
29. control panel opening
30. air handling unit
31. duct blank-off
32. radial impeller fan
33. inlet screen
34. filter retainer screen
35. air filter (can be disposable or re-usable)
36. intake plenum
37. inlet ring
38. fan shroud
39. air flow diverter
40. fan motor
41. chilled water coil
42. condensate pan
43. fan mounting bracket
44. housing
45. insulation
46. alternate supply air opening
47. primary supply air opening
48. filter opening
50. fan access cover
60. raised floor air handling unit
61. ductwork
62. server rack
63. exhaust air plenum of server rack
64. raised floor tile system
65. supply air plenum of server rack
66. cool air distribution
67. underfloor cool air plenum
68. building floor
69. underfloor air supply plenum box
70. exhaust
71. supply air manifold
72. removable manifold end cap
80. rectangular supply register or exhaust grille
81. square supply register or exhaust grille
82. round supply register or exhaust grille

We claim:

1. An air handling system for use in a building with a raised floor formed of a plurality of floor tiles located above a principal floor, thereby forming an air plenum between the principal floor and the raised floor and a working area located above said raised floor, said air handling system used to supply air to electronic equipment located in the working area, said system comprising:

a floor tile having a top surface forming a portion of the raised floor of the working area, a bottom surface forming a top portion of the air plenum, and a supply air passage extending from said bottom surface to said top surface, a fan mounted to said bottom surface of said floor tile, said fan sized and configured to direct air from the air plenum through said supply air passage, an elongated air distribution member having a chamber therein and extending from said supply air passage, said air distribution member having a plurality of openings extending from within said chamber to the work area, said openings being spaced apart along a length of said air distribution member, and a return air duct mounted in a second floor tile and connected to said air handling system.

2. The air handling system of claim 1, wherein said air distribution member is a generally rigid duct.

3. The air handling system of claim 1, further comprising a second supply air passage and a second air distribution member having a second chamber therein, said second air distribution member connected to said second supply air passage and extending upward therefrom, said second air distribution member having a second plurality of openings extending from said second chamber to the work area, said second plurality of openings being vertically spaced apart.

4. The air handling system of claim 1, wherein said plurality of openings is chosen from the group of openings consisting of perforations, nozzles and linear vents.

5. The air handling system of claim 1, further comprising a support bracket located on a rack or cabinet for the electronic equipment, said support bracket configured to support said air distribution member.

6. The air handling system of claim 1, further comprising a chilled water coil mounted below said floor tile and located such that air from said fan passes over said coil.

7. The air handling system of claim 1, wherein said air distribution member is mounted to said top surface of said floor tile.

8. The air handling system of claim 1, wherein said openings are configured to direct air approximately horizontally.

9. The air handling system of claim 1, wherein said openings are configured to direct air at an angle from horizontal.

10. The air handling system of claim 1, further comprising ductwork mounted below the raised floor, said ductwork configured to feed air from said fan to a third floor tile.

11. The air handling system of claim 1, wherein said floor tile has sound dampening properties.

12. The air handling system of claim 1, further comprising a speed control controlling said air handling system.

13. The air handling system of claim 1, further comprising a heat exchange coil mounted below said floor tile.

14. The air handling system of claim 1, wherein said fan is sized and configured to pull air from a remote location.

15. The air handling system of claim 1, wherein said second floor tile is spaced apart from the first floor tile.

16. The air handling system of claim 1, wherein said fan is a radial impeller fan.

17. The air handling system of claim 1, wherein said air distribution member is oriented generally vertically.

18. The air handling system of claim 1, wherein said air distribution member is oriented generally horizontally.

19. An air handling system for use in a building with a raised floor formed of a plurality of floor tiles located above a principal floor, thereby forming an air plenum between the principal floor and the raised floor and a working area located above said raised floor, said air handling system used to supply air to electronic equipment located in the working area, said system comprising:

a floor tile having a top surface forming a portion of the raised floor of the working area, a bottom surface forming a top portion of the air plenum, and a supply air passage extending from said bottom surface to said top surface, a fan mounted to said bottom surface of said floor tile, said fan sized and configured to direct air from the air plenum through said supply air passage, and a flexible, elongated air distribution member having a chamber therein and extending from said supply air passage, said air distribution member having a plurality of openings extending from within said chamber to the work area, said openings being spaced apart along a length of said air distribution member.

20. The air handling system of claim 19, wherein said air distribution member is formed of flexible, anti-static fabric.

21. The air handling system of claim 19, wherein said air distribution member is a flexible duct.

22. The air handling system of claim 19, further comprising a return air duct mounted below the raised floor, said return air duct configured to feed air to said fan.

23. The air handling system of claim 22, further comprising a filter located in an air path between said return air duct and said fan.

24. The air handling system of claim 19, further comprising a return air duct mounted in a second floor tile and connected to said air handling system.

25. An air handling system for use in a building with a raised floor formed of a plurality of floor tiles located above a principal floor, thereby forming an air plenum between the principal floor and the raised floor and a working area located above said raised floor, said air handling system used to supply air to electronic equipment located in the working area, said system comprising:

a floor tile having a top surface forming a portion of the raised floor of the working area, a bottom surface forming a top portion of the air plenum, and a supply air passage extending from said bottom surface to said top surface, a fan mounted to said bottom surface of said floor tile, said fan sized and configured to direct air from the air plenum through said supply air passage, and a flexible air distribution duct connected to said top surface of said floor tile and having a chamber therein, said air distribution member extending upward from said supply air passage, said air distribution member having a plurality of openings extending from within said chamber to the work area, said openings being vertically spaced apart and configured to direct air approximately horizontally.

26. The air handling system of claim 25, wherein said air distribution duct is formed of anti-static fabric.

27. The air handling system of claim 25, further comprising a second supply air passage and a second air distribution duct having a second chamber therein, said second air distribution duct connected to said second supply air passage and extending upward therefrom, said second air distribution duct having a second plurality of openings extending from said second chamber to the work area, said second plurality of openings being vertically spaced apart.

28. The air handling system of claim 25, wherein said plurality of openings is chosen from the group of openings consisting of perforations, nozzles and linear vents.

29. The air handling system of claim 25, further comprising a support bracket located on a rack or cabinet for the electronic equipment, said support bracket configured to support said air distribution duct.

30. The air handling system of claim 25, further comprising a chilled water coil mounted below said floor tile and located such that air from said fan passes over said coil.

* * * * *